(12) United States Patent
Kumar et al.

(10) Patent No.: US 11,366,941 B2
(45) Date of Patent: Jun. 21, 2022

(54) SYSTEMS AND METHODS FOR DESIGNING UNIFIED ARCHITECTURE MODELS FOR ARCHITECTING DIGITAL PRODUCTS AND DIGITAL SERVICES

(71) Applicant: Tata Consultancy Services Limited, Mumbai (IN)

(72) Inventors: Anand Kumar, Pune (IN); Doji Samson Lokku, Hyderabad (IN); Nikhil Ravindranath Zope, Mumbai (IN); Jose Kumar Reddypogu, Hyderabad (IN)

(73) Assignee: Tata Consultancy Services Limited, Mumbai (IN)

( * ) Notice: Subject to any disclaimer, the term of this patent is extended or adjusted under 35 U.S.C. 154(b) by 1013 days.

(21) Appl. No.: 16/035,226

(22) Filed: Jul. 13, 2018

(65) Prior Publication Data
US 2019/0018911 A1 Jan. 17, 2019

(30) Foreign Application Priority Data
Jul. 13, 2017 (IN) .............................. 201721024847

(51) Int. Cl.
*G06F 30/13* (2020.01)
*G06F 30/20* (2020.01)

(52) U.S. Cl.
CPC .............. *G06F 30/13* (2020.01); *G06F 30/20* (2020.01)

(58) Field of Classification Search
CPC ................................ G06F 30/13; G06F 30/20
(Continued)

(56) References Cited

U.S. PATENT DOCUMENTS

| 2016/0150053 A1* | 5/2016 | Janczuk .................. G06F 9/547 709/217 |
| 2016/0224336 A1* | 8/2016 | Zhou ................... G06F 9/44521 |
| 2016/0357531 A1 | 12/2016 | Trofin et al. |

FOREIGN PATENT DOCUMENTS

WO     WO-2016/118979     7/2016

OTHER PUBLICATIONS

Ray, P.P. (Jul. 2018). "A survey on Internet of Things architectures," *Journal of King Saud University—Computer and Information Sciences*, vol. 30, issue 3, pp. 291-319.
(Continued)

*Primary Examiner* — Justin C Mikowski
(74) *Attorney, Agent, or Firm* — Finnegan, Henderson, Farabow, Garrett & Dunner, LLP

(57) ABSTRACT

Systems and methods for designing one or more unified architecture models for architecting digital products and digital services is provided. The traditional systems and methods provide for architecture frameworks or processes for domain specific architectural concerns. Embodiments of the proposed disclosure provide for architecting digital products and digital services by defining a plurality of architectural layers; identifying architectural requirements, extracting a contextual analysis, deriving value propositions, formulating a set of architectural objectives, defining a plurality of system attributes, synthesizing an architectural structure, and designing a plurality of architectural processes corresponding to the one or more unified architecture models; extracting an architectural layer specification for each of the plurality of architectural layers; and designing, based upon the architectural layer specification extracted for each of the plurality of architectural layers, the one or more unified architecture models for architecting a plurality of digital products and digital services.

12 Claims, 13 Drawing Sheets

(58) Field of Classification Search
USPC .............................................................. 703/1
See application file for complete search history.

(56) References Cited

OTHER PUBLICATIONS

Minerva, R. et al. (May 2015). "Towards a definition of the Internet of Things (IoT)," *IEEE—Internet of Things*, issue 1; pp. 1-86.

\* cited by examiner

Defining, by one or more hardware processors, a plurality of architectural layers corresponding to the one or more unified architecture models to be designed ⎯ 301

Performing, for each of the plurality of architectural layers, a plurality of steps in a sequence, wherein the plurality of steps comprise: (i) identifying, a first set of information acquired from a plurality of sources, wherein the first set of information comprises architectural requirements and concerns corresponding to a plurality of digital products and digital services to be architected; (ii) extracting, based upon the first set of information, a second set of information comprising a contextual analysis of the one or more unified architecture models to be designed; (iii) deriving, from the second set of information, a third set of information comprising value propositions corresponding to the one or more unified architecture models to be designed; (iv) formulating, based upon the third set of information, a set of architectural objectives corresponding to the one or more unified architecture models to be designed; (v) defining, based upon the set of architectural objectives, a plurality of system attributes comprising a framework for executing a set of architectural functions, wherein the plurality of system attributes and the set of architectural functions correspond to the one or more unified architecture models to be designed; (vi) synthesizing, based upon the plurality of system attributes defined, an architectural structure comprising a plurality of architectural specifications corresponding to the one or more unified architecture models to be designed; and (vii) designing, based upon the architectural structure, a plurality of architectural processes defining a sequence of steps for architecting the plurality of digital products and digital services, wherein each of the plurality of architectural processes correspond to one of the plurality of architectural layers defined ⎯ 302

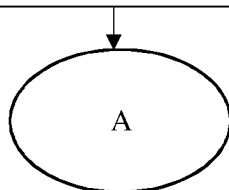

FIG. 3A

SYSTEMS AND METHODS FOR DESIGNING UNIFIED ARCHITECTURE MODELS FOR ARCHITECTING DIGITAL PRODUCTS AND DIGITAL SERVICES

PRIORITY CLAIM

This U.S. patent application claims priority under 35 U.S.C. § 119 to: India Application No. 201721024847, filed on Jul. 13, 2017. The entire contents of the aforementioned application are incorporated herein by reference.

TECHNICAL FIELD

This disclosure relates generally to designing unified architecture models for architecting digital products and digital services, and more particularly to systems and methods for designing unified one or more architecture models for architecting digital products and digital services.

BACKGROUND

With the increasing flow of new products into the market and decreasing product life span, it is getting harder for product organizations to compete and stay relevant in their respective businesses. As a result, it has become essential for these organizations to innovate and create new systems, products and solutions at unprecedented rates which is severely hampering their ability to operate. Some experts in related technologies say that it is necessary for organizations to shift from products to systematic solutions which comprises of both products and service components.

Digital technology facilitates design of solutions that are useful, usable and desirable from the user perspective, and efficient, effective and different from the solution developer perspective. While there are a host of architecting approaches, architecture frameworks, service design methodologies, software architecting approaches and component models in digital technology, the landscape of a business solution (comprising an architectural solution) corresponding to digital products and digital services is still fragmentary because of lack of a complete framework and approach. There are a variety of methodologies outlined in the literature, many of them are presented by their intended use and an in-depth evaluation of these methodologies are limited and in some cases, the methodologies are tailored to specific projects. As a result, there is lack of completeness and correctness in these tools and methods.

SUMMARY

Embodiments of the present disclosure present technological improvements as solutions to one or more of the above-mentioned technical problems recognized by the inventors in conventional systems. For example, in one embodiment, a method for designing one or more unified architecture models for architecting digital products and digital services is provided, the method comprising: defining, by one or more hardware processors, a plurality of architectural layers corresponding to the one or more unified architecture models to be designed; performing, for each of the plurality of architectural layers, a plurality of steps in a sequence, wherein the plurality of steps comprise: identifying, a first set of information acquired from a plurality of sources, wherein the first set of information comprises architectural requirements and concerns corresponding to a plurality of digital products and digital services to be architected; extracting, based upon the first set of information, a second set of information comprising a contextual analysis of the one or more unified architecture models to be designed; deriving, from the second set of information, a third set of information comprising value propositions corresponding to the one or more unified architecture models to be designed; formulating, based upon the third set of information, a set of architectural objectives corresponding to the one or more unified architecture models to be designed; defining, based upon the set of architectural objectives, a plurality of system attributes comprising a framework for executing a set of architectural functions, wherein the plurality of system attributes and the set of architectural functions correspond to the one or more unified architecture models to be designed; synthesizing, based upon the plurality of system attributes defined, an architectural structure comprising a plurality of architectural specifications corresponding to the one or more unified architecture models to be designed; and designing, based upon the architectural structure, a plurality of architectural processes defining a sequence of steps for architecting the plurality of digital products and digital services, wherein each of the plurality of architectural processes correspond to one of the plurality of architectural layers defined; extracting, based upon each of the plurality of architectural processes, an architectural layer specification for each of the plurality of architectural layers; designing, based upon the architectural layer specification extracted for each of the plurality of architectural layers, the one or more unified architecture models for architecting the plurality of digital products and digital services; defining, based upon the plurality of system attributes, a set of architectural properties corresponding to the one or more unified architecture models to be designed; and iteratively performing to generate the plurality of architectural specifications corresponding to the one or more unified architecture models to be designed.

In another embodiment, there is provided a system for designing one or more unified architecture models for architecting digital products and digital services, the system comprising a memory storing instructions; one or more communication interfaces; and one or more hardware processors coupled to the memory via the one or more communication interfaces, wherein the one or more hardware processors are configured by the instructions to: define, a plurality of architectural layers corresponding to the one or more unified architecture models to be designed; perform, for each of the plurality of architectural layers, a plurality of steps in a sequence, wherein the plurality of steps comprise: identify, a first set of information acquired from a plurality of sources, wherein the first set of information comprises architectural requirements and concerns corresponding to a plurality of digital products and digital services to be architected; extract, based upon the first set of information, a second set of information comprising a contextual analysis of the one or more unified architecture models to be designed; derive, from the second set of information, a third set of information comprising value propositions corresponding to the one or more unified architecture models to be designed; formulate, based upon the third set of information, a set of architectural objectives corresponding to the one or more unified architecture models to be designed; define, based upon the set of architectural objectives, a plurality of system attributes comprising a framework for executing a set of architectural functions, wherein the plurality of system attributes and the set of architectural functions correspond to the one or more unified architecture models to be designed; synthesize, based upon the plurality of system attributes defined, an architectural structure comprising a plurality of architectural specifications corresponding to the one or more unified architecture models to be designed; and design, based upon the architectural structure, a plurality of architectural processes defining a sequence of steps for architecting the plurality of digital products and digital services, wherein each of the plurality of architectural processes correspond to one of the plurality of architectural layers defined; extract, based upon each of the plurality of architectural processes, an architectural layer specification for each of the plurality of architectural layers; design, based upon the architectural layer specification extracted for each of the plurality of architectural layers, the one or more unified architecture models for architecting the plurality of digital products and digital services; synthesize the architectural structure by defining, based upon the plurality of system attributes, a set of architectural properties corresponding to the one or more unified architecture models to be designed; and iteratively perform the step of synthesizing the architectural structure to generate the plurality of architectural specifications corresponding to the one or more unified architecture models to be designed.

In yet another embodiment, there is provided one or more non-transitory machine readable information storage mediums comprising one or more instructions which when executed by one or more hardware processors causes the one or more hardware processors to perform a method for designing one or more unified architecture models for architecting digital products and digital services, the method comprising: defining, a plurality of architectural layers corresponding to the one or more unified architecture models to be designed; performing, for each of the plurality of architectural layers, a plurality of steps in a sequence, wherein the plurality of steps comprise: identifying, a first set of information acquired from a plurality of sources, wherein the first set of information comprises architectural requirements and concerns corresponding to a plurality of digital products and digital services to be architected; extracting, based upon the first set of information, a second set of information comprising a contextual analysis of the one or more unified architecture models to be designed; deriving, from the second set of information, a third set of information comprising value propositions corresponding to the one or more unified architecture models to be designed; formulating, based upon the third set of information, a set of architectural objectives corresponding to the one or more unified architecture models to be designed; defining, based upon the set of architectural objectives, a plurality of system attributes comprising a framework for executing a set of architectural functions, wherein the plurality of system attributes and the set of architectural functions correspond to the one or more unified architecture models to be designed; synthesizing, based upon the plurality of system attributes defined, an architectural structure comprising a plurality of architectural specifications corresponding to the one or more unified architecture models to be designed; and designing, based upon the architectural structure, a plurality of architectural processes defining a sequence of steps for architecting the plurality of digital products and digital services, wherein each of the plurality of architectural processes correspond to one of the plurality of architectural layers defined; extracting, based upon each of the plurality of architectural processes, an architectural layer specification for each of the plurality of architectural layers; designing, based upon the architectural layer specification extracted for each of the plurality of architectural layers, the one or more unified architecture models for architecting the plurality of digital products and digital services; defining, based upon the plurality of system attributes, a set of architectural properties corresponding to the one or more unified architecture models to be designed; and iteratively performing to generate the plurality of architectural specifications corresponding to the one or more unified architecture models to be designed.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

FIG. 3A through 3B is a flow diagram illustrating the steps involved in the process of designing the unified architecture models for architecting digital products and digital services, in accordance with some embodiments of the present disclosure.

DETAILED DESCRIPTION

Figure 1:
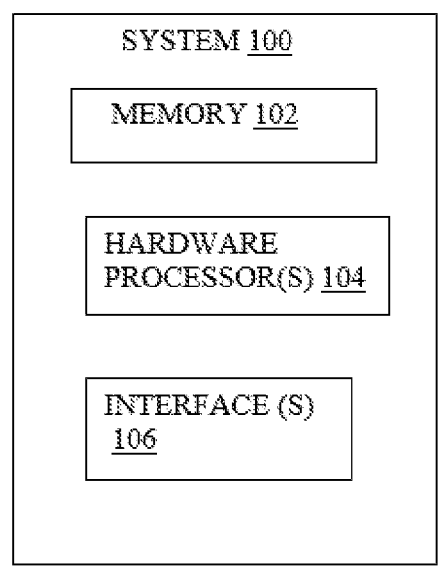
FIG. 1 illustrates a block diagram of a system for generating control system solutions for designing unified architecture models for architecting digital products and digital services, in accordance with some embodiments of the present disclosure.

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims.

Embodiments of the present disclosure provide systems and methods for designing one or more unified architecture models for architecting digital products and digital services. Digital technologies provide the ability to change and evolve digital product and digital service systems at a very fast cycle time. As a result, there is a gradual build-up of capabilities and features over a period of time. The general tendency has been to put as many things as possible into a digital system to be designed, without much consideration to the value that the things would contribute to. Much of this additional capabilities and features are not value adding to all end-users of the system and comprise feature creeps. The feature creeps results in gradual degradation of the digital system to be designed. Further, unnecessary maintenance and fixes that happen on the bloated features tend to diversify the efforts in improving the core offering. Such a situation, results in value-destruction to all stakeholders.

Architecture, as a discipline, has been found to be useful in addressing complexity in different domains. Traditional systems and methods comprise architecture frameworks that helps simply in addressing domain specific architectural concerns. Further, the traditional systems and methods comprise architecture processes that generally address different kinds of architectures. However, the traditional systems and methods lack architecture frameworks or processes to support architecture of digital product or digital service computing platforms. As a result, it becomes necessary for organizations using digital products or digital services to establish new processes, architecture frameworks and related approaches in order to architect digital product-service systems. While there exists tools, methods, approaches for enabling architectures across different domains, no such enablers exists for architecting the digital product or digital service systems.

Hence there is a need for a technology that can used for architecting products, services, software, systems, product-service systems and the digital product or digital service systems, provides for integration mechanisms to develop a unified architecture from the individual architectures pertaining to products, services, systems and software, provides for a single architecting approach that is applicable for the different knowledge domains involved, and provides for architecting across the different knowledge domains comprising digital products, digital services, digital systems and software.

Referring now to the drawings, and more particularly to FIG. 1 through 12, where similar reference characters denote corresponding features consistently throughout the figures, there are shown preferred embodiments and these embodiments are described in the context of the following exemplary system and/or method.

FIG. 1 illustrates an exemplary block diagram of a system 100 for designing one or more unified architecture models for architecting digital products and digital services, in accordance with an embodiment of the present disclosure. In an embodiment, the system 100 includes one or more processors 104, communication interface device(s) or input/output (I/O) interface(s) 106, and one or more data storage devices or memory 102 operatively coupled to the one or more processors 104. The one or more processors 104 that are hardware processors can be implemented as one or more microprocessors, microcomputers, microcontrollers, digital signal processors, central processing units, state machines, logic circuitries, and/or any devices that manipulate signals based on operational instructions. Among other capabilities, the processor(s) is configured to fetch and execute computer-readable instructions stored in the memory 102. In an embodiment, the system 100 can be implemented in a variety of computing systems, such as laptop computers, notebooks, hand-held devices, workstations, mainframe computers, servers, a network cloud and the like.

The I/O interface device(s) 106 can include a variety of software and hardware interfaces, for example, a web interface, a graphical user interface, and the like and can facilitate multiple communications within a wide variety of networks N/W and protocol types, including wired networks, for example, LAN, cable, etc., and wireless networks, such as WLAN, cellular, or satellite. In an embodiment, the I/O interface device(s) can include one or more ports for connecting a number of devices to one another or to another server.

The memory 102 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes.

Figure 2:
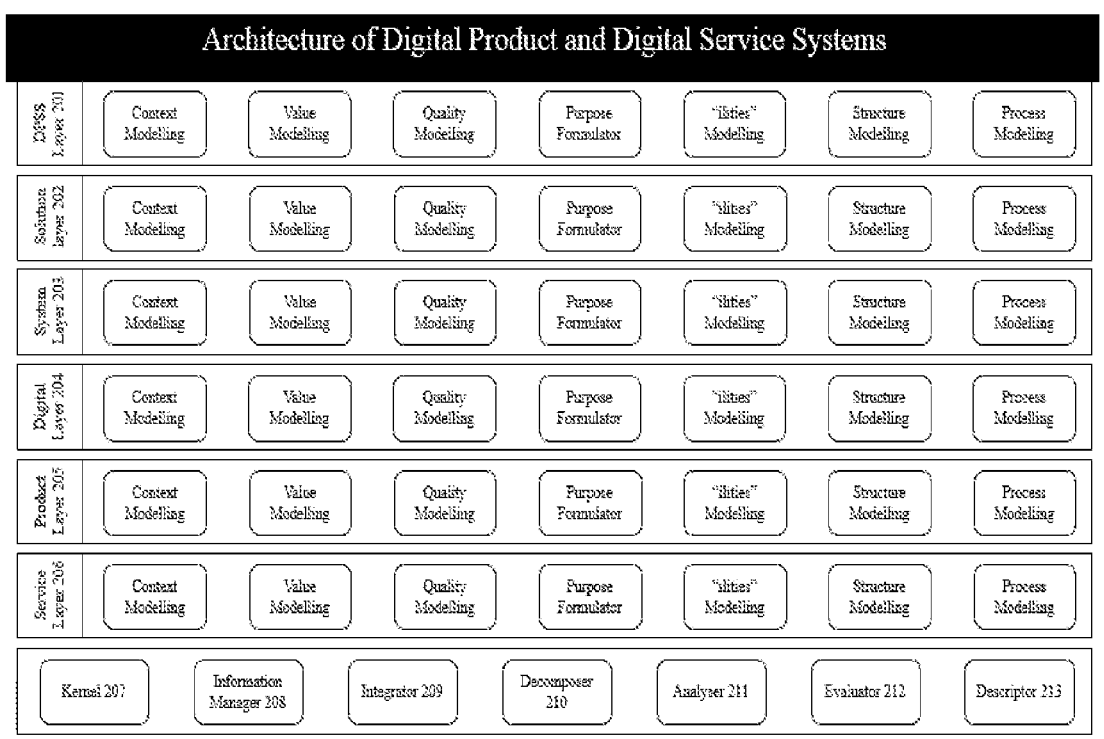
FIG. 2 is an architectural diagram depicting components and flow of the system for designing the unified architecture models for architecting digital products and digital services, in accordance with some embodiments of the present disclosure.

FIG. 2 is an architectural diagram depicting components and flow of the system for designing the one or more unified architecture models for architecting digital products and digital services, in accordance with some embodiments of the present disclosure. Referring to FIG. 2, it may be noted that the architecture comprises a Digital Product-Service System (DPSS) Layer 201, a Solution Layer 202, a System Layer 203, a Digital Layer 204, a Product Layer 205, and a Service Layer 205. The functions of each of the layers have been explained in paragraph 27. A Kernel 207 provides enabling capabilities, services and resources for utilizing and integrating other components. In Information Manager 208 provides enabling capabilities, services and resources that enables synthesizing, evaluation and elaboration of information resources and flows between them.

Referring to FIG. 2 again, an Integrator 209 facilitates integration between various other components. A Decomposer 210 facilitates problem space decomposition across multiple layers. An Analyser Component 211 provides shared capabilities, services and resources for evaluating different kinds of architectures (product architecture, service architecture, system architecture and digital technology architecture). An Evaluator 212 evaluates a synthesized architecture at each of the layers to determine whether the concerns specific to that layer (wherein the synthesized architecture is being evaluated) are addressed completely by the synthesized architecture. A Descriptor 213 generates information items pertaining to the processes supported by the digital product-service system.

Figure 3B:
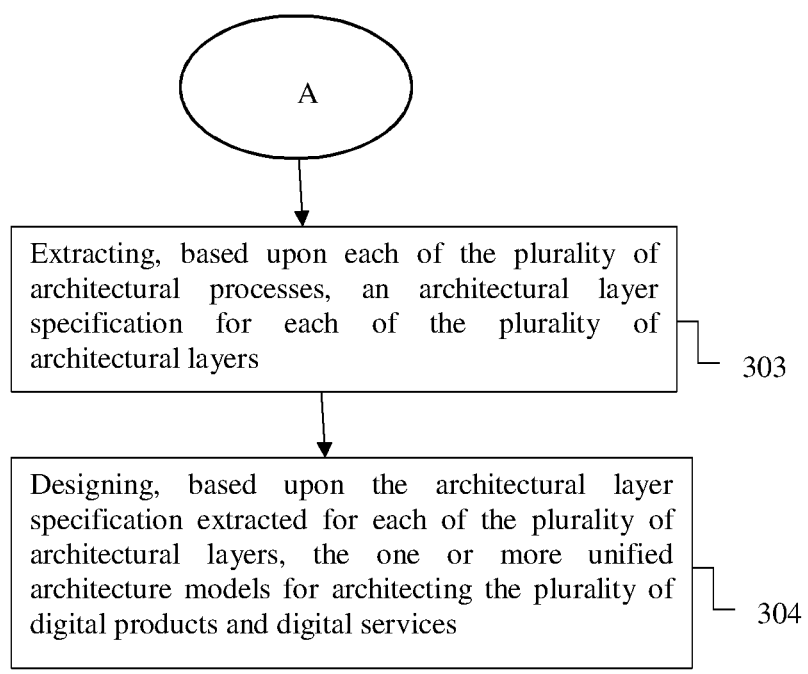

FIG. 3A through 3B, with reference to FIGS. 1 and 2, illustrates an exemplary flow diagram of a method for designing the one or more unified architecture models for architecting digital products and digital services, in accordance with some embodiments of the present disclosure. In an embodiment the system 100 comprises one or more data storage devices of the memory 102 operatively coupled to the one or more hardware processors 104 and is configured to store instructions for execution of steps of the method by the one or more processors 104. The steps of the method of the present disclosure will now be explained with reference to the components of the system 100 as depicted in FIG. 1 and the flow diagram. In the embodiments of the present disclosure, the hardware processors 104 when configured the instructions performs one or more methodologies described herein.

According to an embodiment of the present disclosure, at step 301, the one or more hardware processors 104 define a plurality of architectural layers corresponding to the one or more unified architecture models to be designed. In an embodiment, the plurality of architectural layers comprise the DPSS Layer 201, the Solution Layer 202, the System Layer 203, the Digital Layer 204, the Product Layer 205, and the Service Layer 206 (shown in FIG. 2). The functions of each of the plurality of architectural layers may comprise (but not limited to):

Digital Product-Service Systems (DPSS Layer) 201—The DPSS layer 201 deals with a composite digital product-service system as a whole. It also deals with architectural concerns (discussed in detail in step 302), constraints, and boundary conditions that may emerge due to the presence of digital technologies, products and services collectively as a unified entity. In an embodiment, each of these elements may be designed individually and composed together keeping in mind the overall concerns of the stakeholders.

Solution Layer 202: The solution layer 202 addresses the architectural concerns at an abstract level without recourse to technology, products, services or systems. The solution layer 202 in general is predominantly concerned with the native aspects of the problem/difficulty as seen and experienced by the relevant stakeholders.

System Layer 203: The systems layer 203 deals with the architectural concerns at a systemic level while taking into account the environment in which the system will function, the boundary conditions, and the abstract phenomenon and concepts that needs to be dealt with.

Digital Layer 204: The digital layer 204 address the architectural concerns related to a plurality of digital technologies, wherein the plurality of digital technologies may be amongst Mobility (anytime, anywhere, real-time availability), Social Media (trend based decision-support systems), Big Data and Analytics (data based decision making), Cloud (dynamic resource provisioning), Robotics and Artificial Intelligence (data driven intelligence systems) and Internet of Things (smart objects and sensory systems).

Product Layer 205: The products layer 205 deals with the concerns, constraints, capabilities and capacities that may be required to be taken into consideration in order to correlate architected capabilities and engineered capacities with the domain of the products in which the customer's business exist and where the product part of the system are utilized.

Services Layer 206: The services layer 206 deals with the concerns, constraints, capabilities and capacities that may be required to be taken into consideration in order to correlate the architected capabilities and engineered capacities with the domain of the service in which the customer's business exist and where the services are delivered.

According to an embodiment of the present disclosure, at step 302, the one or more hardware processors 104 perform, for each of the plurality of architectural layers, a plurality of steps in a sequence. At step 302(i), the one or more hardware processors 104 identify a first set of information from a plurality of sources, wherein the first set of information comprises architectural requirements and concerns corresponding to a plurality of digital products and digital services to be architected.

In general, a computing system is architected and engineered for human utilization and implementation. As a result, determining relevance of the computing system for the concerned stakeholders comprises an essential element of architecting. Stakeholders normally comprise an individual or a group of people or organizations likely to be impacted or influenced by the computing system to be architected. The architectural requirements and concerns forming stakeholder concerns are significant to the stakeholders since collectively, the architectural requirements and concerns may potentially impact or influence the stakeholders in a positive or a negative way. Often, difficulties, problems, issues, opportunities, risks, assumptions, threats and constraints experienced by the stakeholders in one or more problem areas are considered as stakeholders concerns. In an embodiment, the first set of information may thus be identified from the plurality of sources comprising an organization or an individual etc. having architecting requirements to architect digital products and digital services.

Considering an example scenario, in developed and developing countries, a growing percentage of aged population and care needed by them is gaining significant importance. Digital products and digital services (implementing cloud/Internet of Things (IoT)/digital technologies) and smart health monitoring devices/applications comprise an important source of smart health monitoring. The gamut of things that may cover under the ambit of solutions for this problem (that require an architectural solution) may vary from country to country and also amongst the smart/digital solution providers. Some of the smart/digital solution providers consider assistance to older people as an assisted living, some others consider a smart community home as the assisted living while some other may consider robot-aided care as the assisted living. The problem may thus require designing unified architecture models for architecting digital products and digital services to implement the smart health monitoring and other related things.

The first set of information that may be identified in such a scenario may comprise a plurality of stakeholders requiring the smart health monitoring such as care takers (people to be observed), care givers (team of organizations and individuals), community (local organization of care takers), sponsor (who has concerns for the care taker and pays for it), government (concerned about ageing communities), service providers (different organizations providing different services), and suppliers (different organizations providing different resources, supplies, infrastructure and equipment), the architectural requirements and concerns forming stakeholder concerns, wherein the architectural requirements may comprise auditability of decisions, collected information and transformations, 24×7 availability and built-in fail-safety and redundancy, multiple ways to sense wellness indicators, different levels of detail and maintaining historical information, and different kinds of alerts and notifications, and wherein the architectural concerns may be as shown in Tables 1 and 2 below.

TABLE 1

| Care taker | Care giver | Service provider | Supplier |
| --- | --- | --- | --- |
| Quality care | Quick detection | Timely information | Timely information |
| Less intrusion | Early resolution | Resource availability | Resource availability |
| Freedom & privacy | False positives | Time to service | Time to deliver |
| Right/timely intervention | Right/timely intervention | Quality of service | Quality of parts |
| Fast recovery | Caring many care takers | Success rate | Volume & throughput |
| Active living | Clear guidelines | Service failure | Frequency of failures |

TABLE 2

| Community | Sponsor | Government |
|---|---|---|
| Aging in place | Quality of care | Preventing disability |
| Familiarity, comfortability | Quality of living of care taker | Maintaining independence |
| Personalized care | Assisted living costs | Rehabilitation |
| Safety | Zero life-threatening incidents | Scale and complexity |
| Wellness and Health | Maintaining function | Infrastructure & related costs |
|  |  | Policies & regulations |

According to an embodiment of the present disclosure, at step 302(ii), the one or more hardware processors 104 extract, based upon the first set of information, a second set of information comprising a contextual analysis of the one or more unified architecture models to be designed. The second set of information facilitates understanding customer, customer's business, the alterable and the right problem perspective. A plurality of tasks are identified in context perspective for different activities. The different activities comprise understanding the context, scope of the context, express the context and elaborate the context.

In general, an architecting system (to be designed) may be conceived based on an understanding of the context in relation to the stakeholders concerns, and responsibilities of the stakeholders while taking into account one or more specific requirements relevant to that context. The second set of information thus facilitates analysing and understanding of the stakeholders, business of the stakeholders in which the architecting system to be designed is to be implemented, boundaries of the implementation, architectural constraints and scope, and right problem perspective. Considering the same example scenario, the second set of information comprising the contextual analysis (that may be extract based upon the first set of information) may be as below:

Health indicators for wellness established upfront;

Actual information obtained by examining care takers;

Different information kinds/types captured and transformed;

Sensors are intrusive or non-intrusive based on the health indicator;

Specialized equipment require trained technicians;

Lag health indicators captured after something has occurred;

Real-time health indicators captured while something is happening;

Lead health indicators established based on historical data; and

Captured information is used to identify wellness levels.

According to an embodiment of the present disclosure, at step 302(iii), the one or more hardware processors 104 derive, from the second set of information, a third set of information comprising value propositions corresponding to the one or more unified architecture models to be designed. The third set of information in value proposition definition process may comprise understanding stakeholder's value, identifying one or more sources and carriers of value, developing a value proposition and elaborating the value proposition. Considering the same example scenario of the smart health monitoring, referring to Table 3, the third set of information (that may be extract based upon the second set of information) may comprise:

TABLE 3

| Beneficiary | Benefits |
|---|---|
| Care taker | Meaning and Contentment in Life |
|  | Care without any expectation |
|  | Sense of being needed, cared for and wanted |
| Care giver | Excellence in caring |
|  | Satisfaction in service |
|  | Knows exactly what to do in any situation |
| Sponsor | Personal satisfaction |
|  | A healthy, full-life, with minimum disruption |
| Service Provider | Elevation above the competition |
|  | The smartest way to health service |
| Supplier | Knows exactly what to provide and when |
|  | No tech headaches and hurdles |
| Community | Turning lives around |
|  | Healthier with less effort |
| Government | Elderly health care without the hassles |

According to an embodiment of the present disclosure, at step 302(iv), the one or more hardware processors 104 formulate, based upon the third set of information, a set of architectural objectives corresponding to the one or more unified architecture models to be designed. The set of architectural objectives facilitate defining architectural objectives or statements of the one or more unified architecture models to be designed. The set of architectural objectives that may be formulated comprise understanding the architectural objectives or statement, identify necessary resources, formulate purpose statement, and express the purpose statement corresponding to the one or more unified architecture models. Considering the same example scenario, the set of architectural objectives corresponding to the one or more unified architecture models to be designed may comprise:

"Monitor wellness using devices of different form factors", wherein the health indicators are captured non-intrusively and appropriate notifications and alerts are generated to appropriate stakeholders based on notification rules.

According to an embodiment of the present disclosure, at step 302(v), the one or more hardware processors 104 define, based upon the set of architectural objectives, a plurality of system attributes comprising a framework for executing a set of architectural functions, wherein the plurality of system attributes and the set of architectural functions correspond to the one or more unified architecture models to be designed. The plurality of system attributes define a pluralities of ilities (or qualities) of the one or more unified architecture models in a specific dimension to achieve the set of architectural objectives formulated. The defined attributes thus facilitate understanding of the pluralities of ilities, adopt relevant characteristics corresponding to the plurality of system attributes, specify desired quality characteristics, and engineer quality characteristics.

Considering the same example scenario, the plurality of system attributes (or the pluralities of ilities) for "Monitor wellness using devices of different form factors" to implement the smart health monitoring may comprise:

Multiple wellness indicators contribute to overall wellness;

Indicators are measured using multitude of sensors in real-time;

Sensory data is integrated in real-time based on different rules and criteria;

Sensory data is transformed in real-time based on different rules, formulae and criteria;

Each sensor can be configured to capture different levels of detail; and

Sensors are of varying complexity and there are different factors governing each sensor.

According to an embodiment of the present disclosure, at step 302(vi), the one or more hardware processors 104 synthesize, based upon the plurality of system attributes defined, an architectural structure comprising a plurality of architectural specifications corresponding to the one or more unified architecture models to be designed. The architectural structure comprises the plurality of architectural specifications, a plurality of components, interrelationships amongst the plurality of components to represent a state and behaviour(s) that the one or more unified architecture models might exhibit. A structure perspective facilitates providing a governing framework and one or more appropriate ways and means for conceptualizing, synthesizing and creating a representation of the one or more unified architecture models in a form suitable for communication to relevant stakeholders.

In an example implementation of the step 302(vi), the plurality of architectural specifications may comprise:
Integrates different kinds of sensors of varying form factors;
Collects data of varying complexity;
Collects data in real-time based on different sensor configurations;
Transforms, processes and analyses mined data in real-time; and
Generates real-time notifications and alerts based on different criteria.

Figure 4:
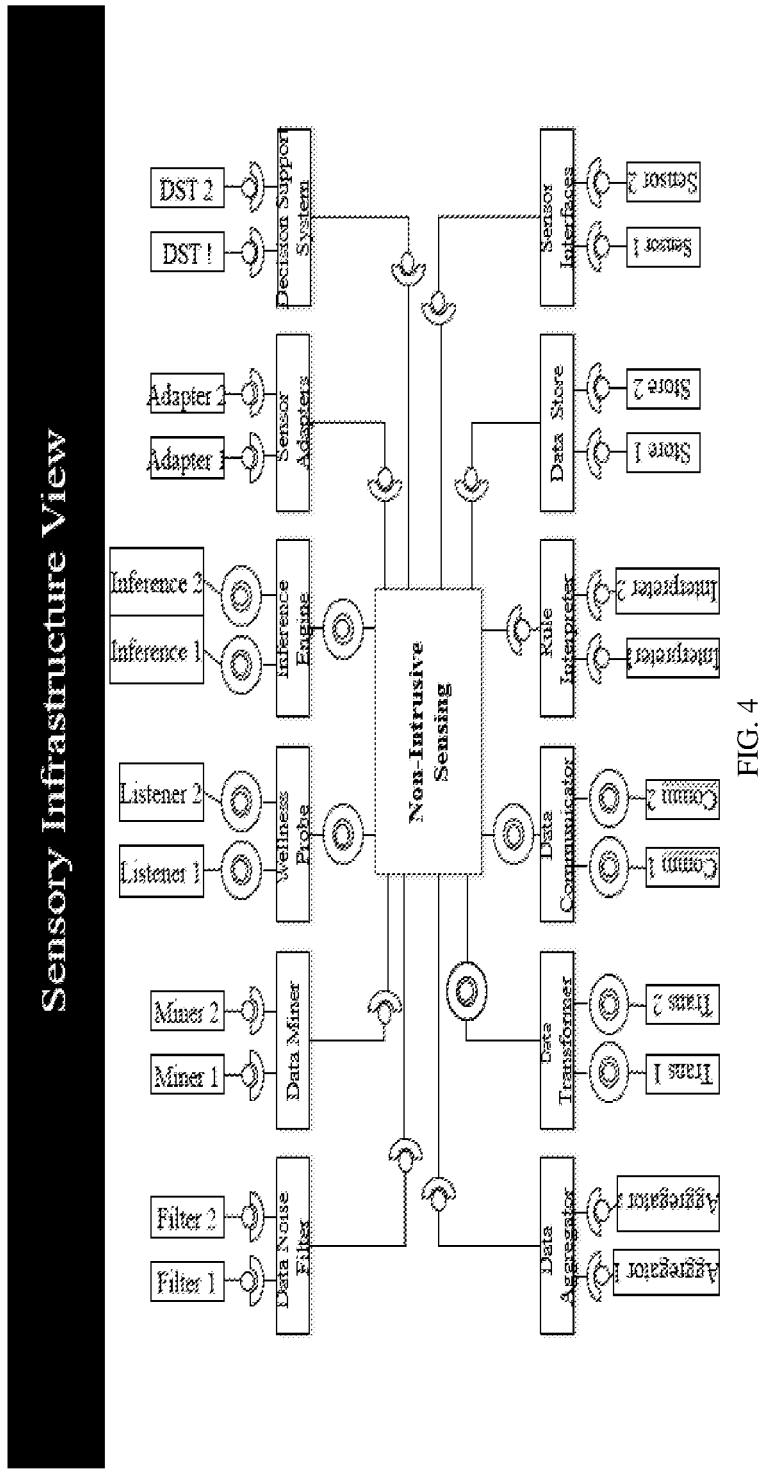
FIG. 4 illustrates an example of an architectural structure corresponding to a smart health monitoring comprising a plurality of components and the interrelationships amongst the plurality of components, in accordance with some embodiments of the present disclosure.
Figure 5:
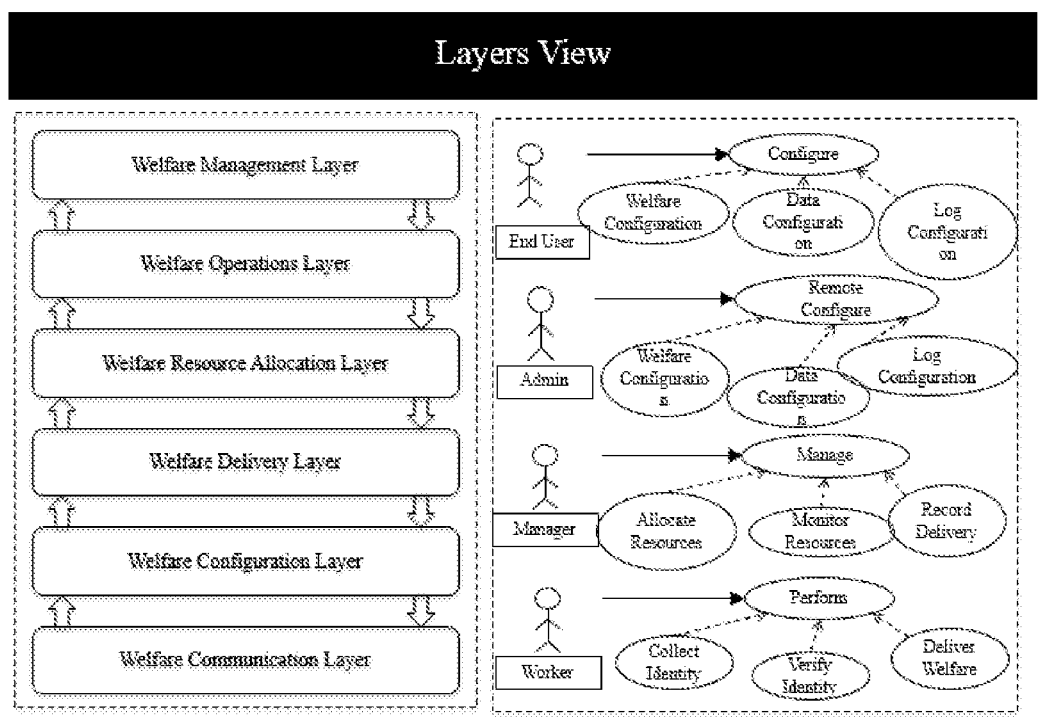
FIG. 5 illustrates an example of a plurality of architectural processes designed and providing an operation view corresponding to the smart health monitoring system, in accordance with some embodiments of the present disclosure.
Figure 6:
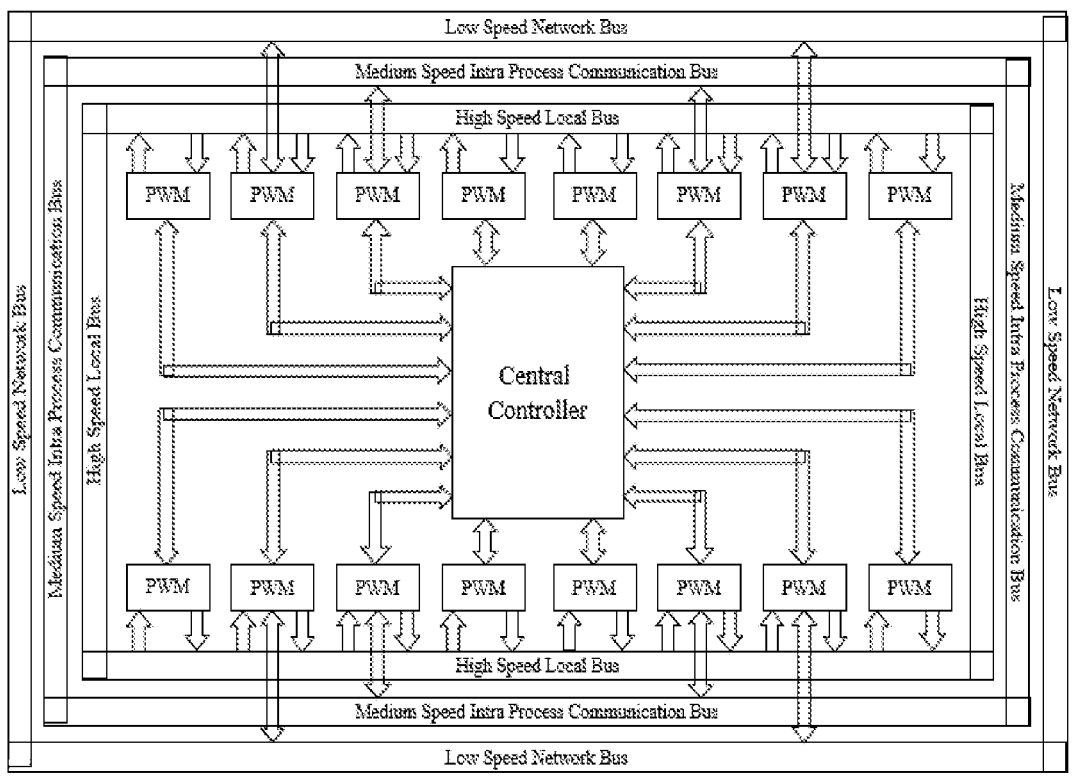
FIG. 6 through 9 illustrates examples of architectural layer specifications extracted for one or more architectural layers amongst a plurality of architectural layers, in accordance with some embodiments of the present disclosure.
Figure 7:
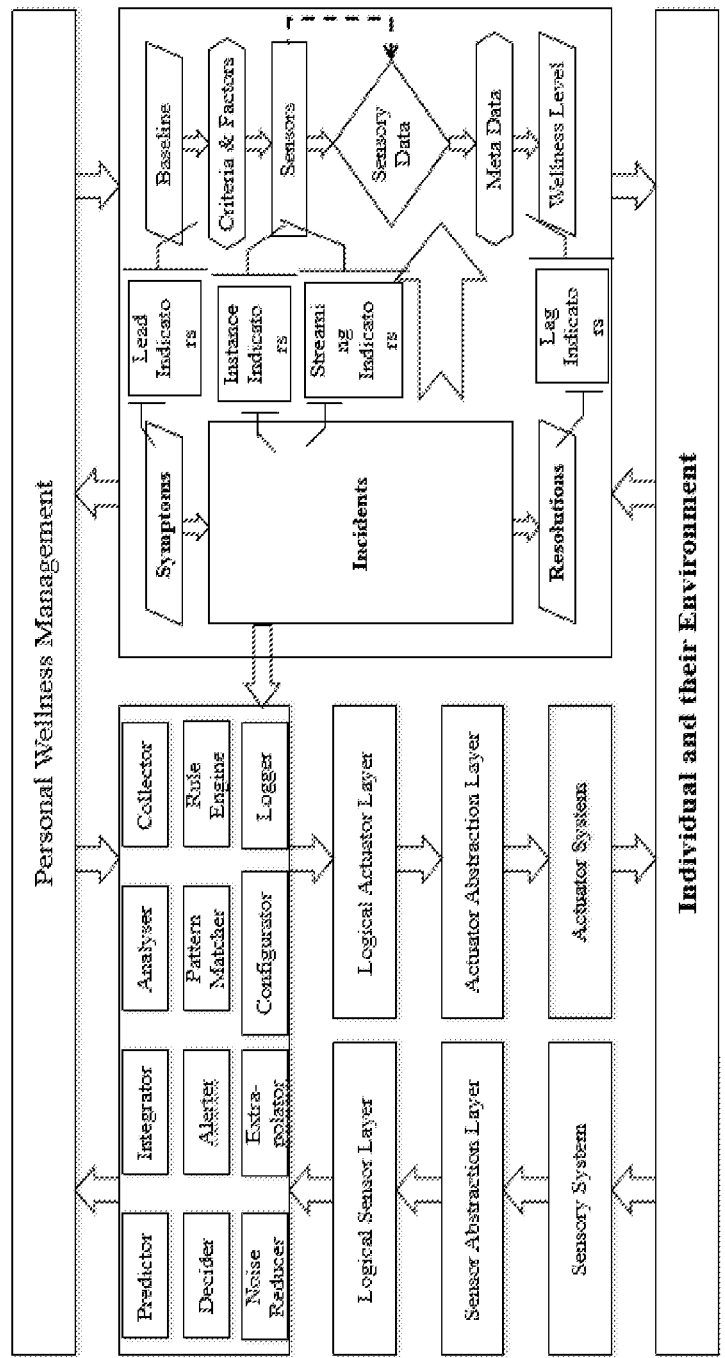
Figure 8:
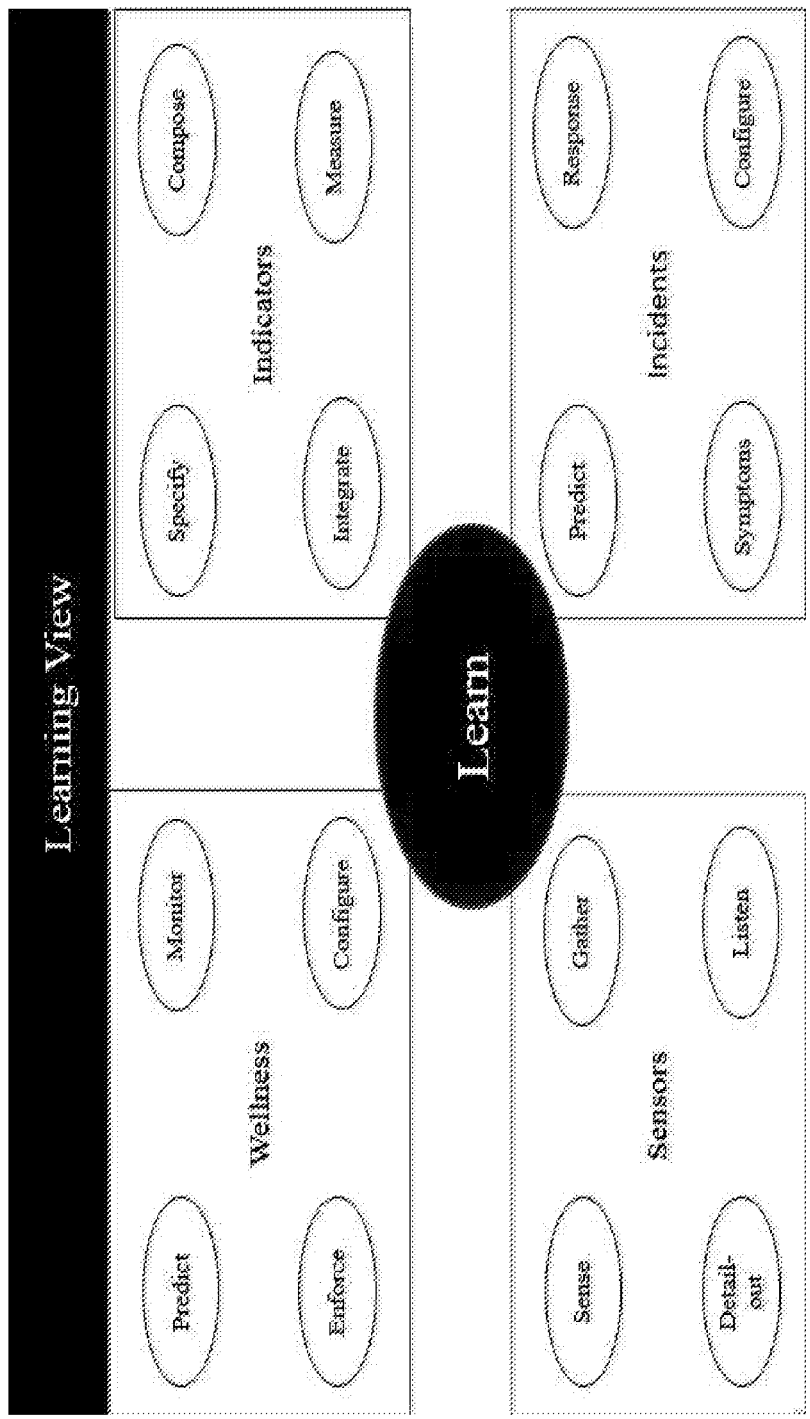
Figure 9:
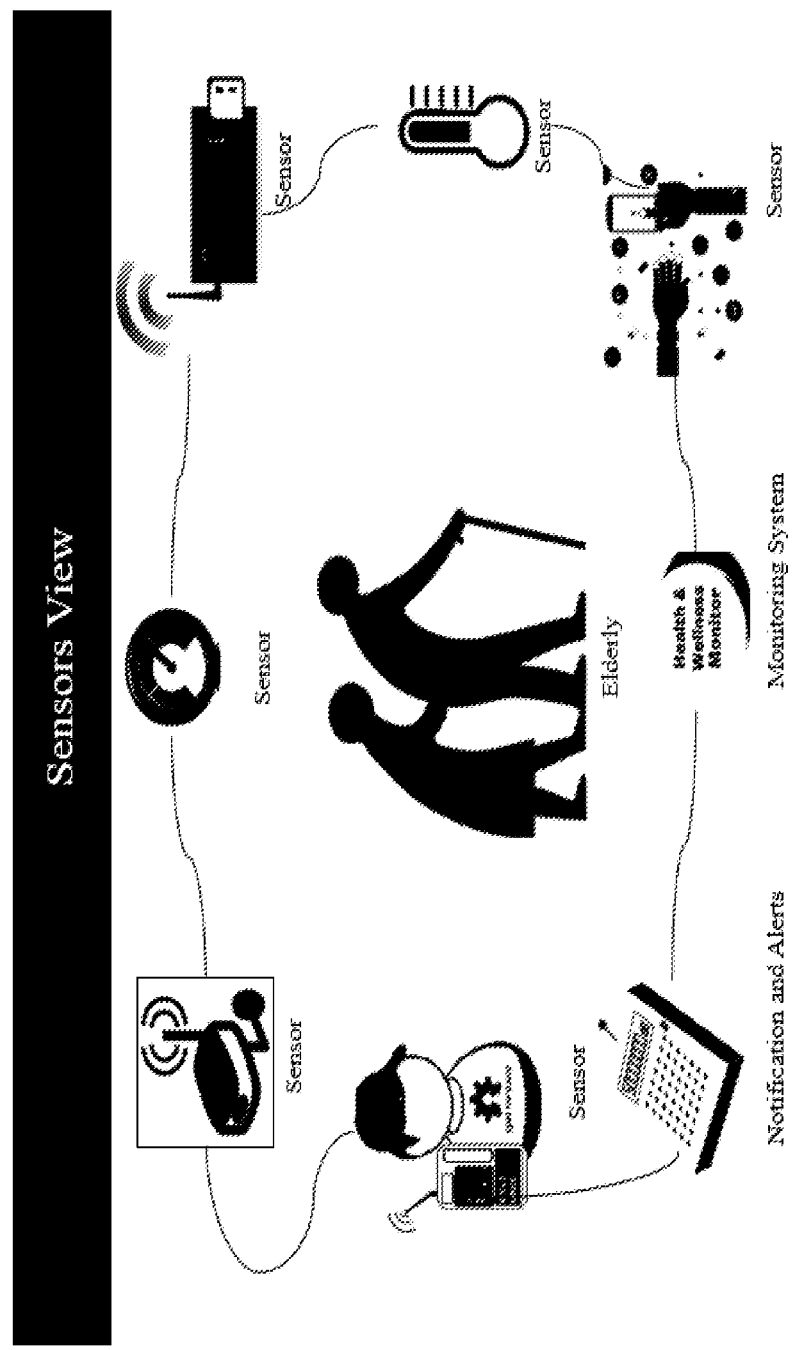

Further, referring to FIG. 4, an example of the architectural structure corresponding to the smart health monitoring comprising the plurality of components and the interrelationships amongst the plurality of components may be referred. In an embodiment, the step of synthesizing the architectural structure comprises defining, based upon the plurality of system attributes, a set of architectural properties corresponding to the one or more unified architecture models to be designed. In an example implementation, the set of architectural properties may comprise:
Whether the one or more unified architecture models to be designed are resilient, modular, compatible and extensible when integrated with different digital products or services on a different platform.

In an embodiment, the step of synthesizing the architectural structure is iteratively performed by the one or more hardware processors 104 to generate the plurality of architectural specifications corresponding to the one or more unified architecture models to be designed. In an embodiment, iteration is a key to understanding and architecting of the digital products and digital services. The Iteration facilitates in applying a set of rules across a plurality of diverse elements (example) to create a complex phenomenon. The Iteration further facilitates an examination of a set of assumptions and properties (example) across multiple iterations so as to establish the validity, in order to successfully produce an understanding of the entire one or more unified architectural models.

According to an embodiment of the present disclosure, at step 302(vii), the one or more hardware processors 104 design, based upon the architectural structure, a plurality of architectural processes defining a sequence of steps for architecting the plurality of digital products and digital services, wherein each of the plurality of architectural processes correspond to one of the plurality of architectural layers defined. In general, processes (or architectural processes) are considered as an arrangement of steps arranged in a specific order that when performed delivers a work product of desired quality. Processes are the means by which the resources of the system are utilized. The goal of processes is to provide a mechanism for value creation. Each of these processes can be invoked as required at any time during the life cycle of the system. A process is structurally a related set of activities with information flows between them.

In an embodiment, the plurality of architectural processes facilitate in providing the ways and means that define how one or more resources corresponding to the one or more unified architecture models are utilized to achieve the plurality of system attributes defined. The plurality of architectural processes further provide appropriate ways and means to ensure that supporting capabilities and resources needed to utilize the one or more unified architecture models (to be designed) are available when and where necessary. In an example implementation, referring to FIG. 5, the plurality of architectural processes designed and providing an operation view corresponding to the smart health monitoring may be referred.

According to an embodiment of the present disclosure, at step 303, the one or more hardware processors 104 extract, based upon each of the plurality of architectural processes, an architectural layer specification for each of the plurality of architectural layers. In an embodiment, each of the plurality of architectural processes involve a specification corresponding to the one or more unified models to be designed and thus facilitates catering of desired architectural situation context. Considering the example scenario of the smart health monitoring yet again, and referring to FIG. 6 through 9, examples of architectural layer specifications may be referred.

Referring to FIG. 6 through 9 again, it may be noted that each of the architectural layer specifications referred to in FIG. 6 through 9 comprises one or more components (for example, a Central Controller, a sensor), interactions between the one or more components, one or more internal layers of communication (for example, a logical sensor layer and a sensor abstraction layer), and a plurality of activities that could be performed by the users (for example, monitoring of alerts). Referring to FIG. 6 through 9 yet again, it may be noted that the architectural layer specification deals with the architectural concerns at a systemic level while taking into account the environment in which the one or more unified architectural model (to be designed) will function, boundary conditions(s), and abstract phenomenon and concepts to be managed.

Figure 10:
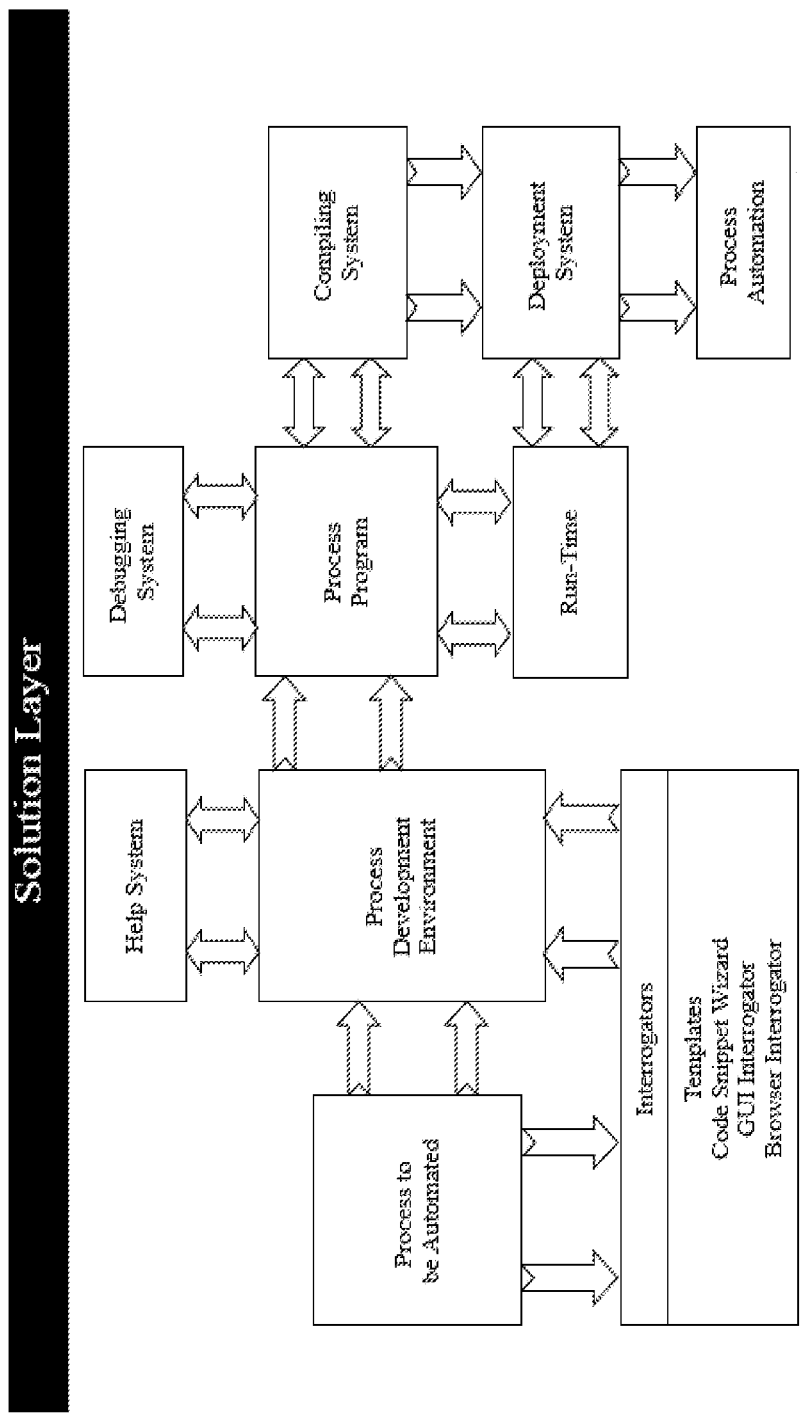
FIG. 10 through 12 illustrates examples of one or more unified architecture models designed for architecting digital products and digital services, in accordance with some embodiments of the present disclosure.
Figure 11:
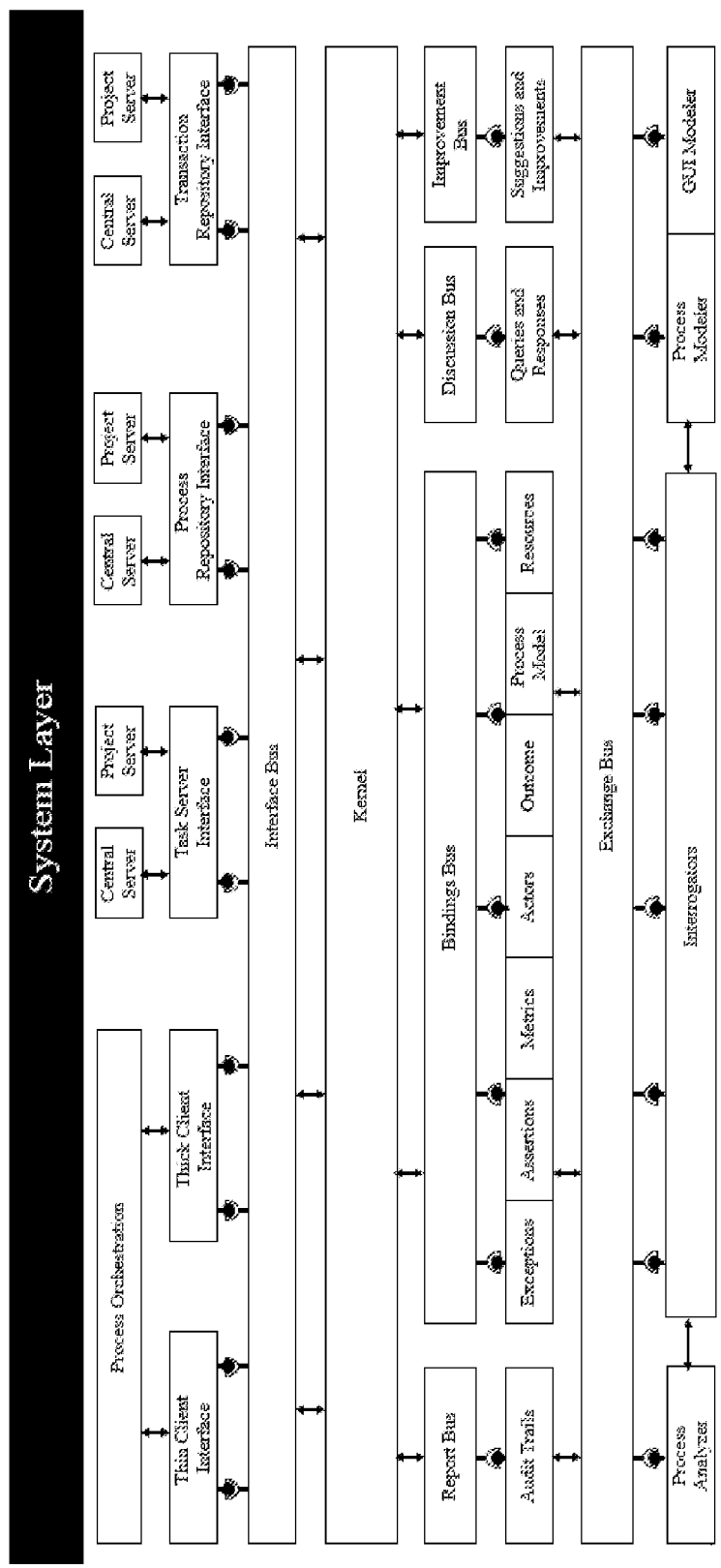
Figure 12:
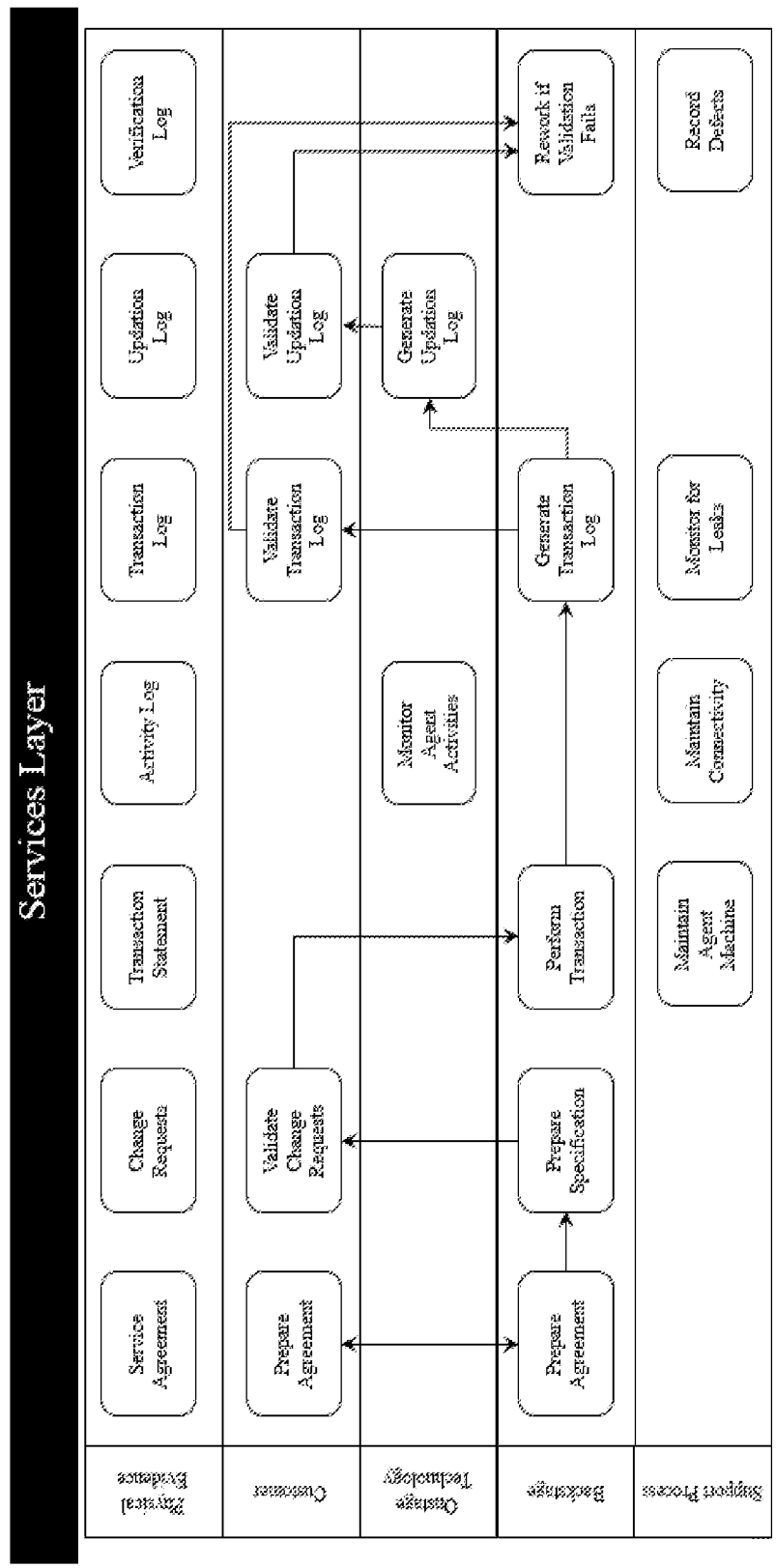

According to an embodiment of the present disclosure, at step 304, the one or more hardware processors 104 design, based upon the architectural specification extracted for each of the plurality of architectural layers, the one or more unified architecture models for architecting the plurality of digital products and digital services, wherein the one or more unified architecture models are unified across the plurality of architectural layers. In an embodiment, the one or more unified architectural models comprise a hierarchical form with leaf nodes, further comprising architecture model (s) of the sub-layers (not shown in the figure). Referring to FIG. 10 through 12, examples of the one or more unified architecture models designed may be referred.

According to an embodiment of the present disclosure, the one or more unified architecture models designed may now be explained in detail. It may be recalled that the plurality of architectural layers defined comprise, inter-alia, the solution layer 202, the system layer 203 and the services layer 206. As discussed above, the solution layer 202 addresses the architectural concerns at the abstract level without recourse to technology, products, services or systems. Similarly, the systems layer 203 deals with the architectural concerns at the systemic level while taking into account the environment in which the system will function, the boundary conditions, and the abstract phenomenon and concepts that needs to be dealt with. Finally, the services layer 206 deals with the concerns, constraints, capabilities and capacities that may be required to be taken into consideration in order to correlate the architected capabilities and engineered capacities with the domain of the service in which the customer's business exist and where the services are delivered.

The proposed methodology thus facilitates integrating knowledge related to the three layers (that is, the solution layer 202, the system layer 203 the services layer 206) together to present a unified architectural model that spans across the layers. While in architecting digital products and digital services, each of the plurality of architectural layers discussed above may be considered, for illustration purposes, the proposed disclosure cites the one or more unified architecture models are unified across three architectural layers amongst the plurality of architectural layers.

In another embodiment, referring to FIG. 10 through 12 yet again, it may be noted that the one or more unified architecture models facilitate a separation of the architectural concerns. The separation of the architectural concerns provides an ability to deal with a plurality of architectural issues corresponding to an architectural problem individually, so that it is possible to concentrate on each the plurality of separately. In the case of the digital products and digital services, multiple knowledge domains may be involved, thereby requiring a need to handle the related concerns in distinct layers of an architecture corresponding to the digital product and digital service systems. Referring to FIG. 10 through 12 yet again, the three different horizontal layers, which correspond to the multiple knowledge domains involved in the architecture of digital products and digital service comprise the solution layer 202, the system layer 203 and the services layer 206.

According to an embodiment of the present disclosure, the advantages of the proposed methodology may now be considered in detail. The proposed methodology facilitates providing for architecture frameworks that may be implemented for architecting products, services, software, systems, the plurality of digital products and digital services. It provides for an integration mechanism(s) that may be used for developing a unified architecture model from a plurality of individual architectures pertaining to products, services, systems and software etc.

None of the traditional systems and methods provide for architecting tools and technologies that may be applicable for architecting across the multiple knowledge domains (like products, services, systems, software, product-service systems). Each of the multiple knowledge domain utilizes different tools and different technologies that is not useful in the other domain. The proposed disclosure thus provides for a common ontology and vocabulary that may be applicable across multiple different knowledge domains.

The proposed disclosure provides for a methodology for architecting the plurality of digital products and digital services based on the customer experience, customer satisfaction, customer delight and thus, customer outcomes that it provides thereby making the offering more value adding to its customer stakeholders. The proposed disclosure thus facilitates an identification of the desired experience, satisfaction, delight levels, identification of the desired customer outcomes, translation of the constructs (that's is, satisfaction, delight levels etc.) to appropriate benefits by utilizing the experience and benefits correlation, mapping the benefits to stakeholder's value by utilizing benefits and value correlation, mapping the stakeholders value to quality characteristics of the plurality of digital products and digital services by utilizing value and quality correlation, synthesizing digital products and digital services architecture by utilizing quality and architecture correlation, and designing the underlying architectural system and usage processes by utilizing architecture and process correlation.

The proposed disclosure further facilitates a seamless interaction between the constructs spanning a plurality of perspectives (for example, context, value, quality, purpose etc.) to arrive at an intervention that will serve as a differentiator to the system acquirers. By addressing the architectural concerns of digital technologies, products, services, systems, and for the composed digital products and digital service systems the proposed disclosure makes the architecting process easy to adopt and implement.

In an embodiment, the memory 102 can be configured to store any data that is associated with designing the one or more unified architecture models for architecting digital products and digital services. In an embodiment, the information pertaining to the first set of information, the second set of information, the third set of information, the set of architectural objectives formulated, the plurality of system attributes defined, the architectural structure, the architectural layer specification for each of the plurality of architectural layers, and the one or more unified architecture models designed etc. is stored in the memory 102. Further, all information (inputs, outputs and so on) pertaining to designing the one or more unified architecture models for architecting digital products and digital services may also be stored in the database, as history data, for reference purpose.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

What is claimed is:

1. A method of designing one or more unified architecture models for architecting digital products and digital services, the method comprising a processor implemented steps of:
    defining, by one or more hardware processors, a plurality of architectural layers corresponding to the one or more unified architecture models to be designed (301);
    performing, for each of the plurality of architectural layers, a plurality of steps in a sequence, wherein the plurality of steps comprise (302):
        identifying, a first set of information acquired from a plurality of sources, wherein the first set of information comprises architectural requirements and concerns corresponding to a plurality of digital products and digital services to be architected (302(i));
        extracting, based upon the first set of information, a second set of information comprising a contextual analysis of the one or more unified architecture models to be designed (302(ii));
        deriving, from the second set of information, a third set of information comprising value propositions corresponding to the one or more unified architecture models to be designed (302(iii));
        formulating, based upon the third set of information, a set of architectural objectives corresponding to the one or more unified architecture models to be designed (302(iv));
        defining, based upon the set of architectural objectives, a plurality of system attributes comprising a framework for executing a set of architectural functions, wherein the plurality of system attributes and the set of architectural functions correspond to the one or more unified architecture models to be designed (302(v));
        synthesizing, based upon the plurality of system attributes defined, an architectural structure comprising a plurality of architectural specifications corresponding to the one or more unified architecture models to be designed (302(vi)); and
        designing, based upon the architectural structure, a plurality of architectural processes defining a sequence of steps for architecting the plurality of digital products and digital services, wherein each of the plurality of architectural processes correspond to one of the plurality of architectural layers defined (302(vii));
    extracting, based upon each of the plurality of architectural processes, an architectural layer specification for each of the plurality of architectural layers (303); and
    designing, based upon the architectural layer specification extracted for each of the plurality of architectural layers, the one or more unified architecture models for architecting the plurality of digital products and digital services (304).

2. The method of claim 1, wherein the step of synthesizing the architectural structure comprises defining, based upon the plurality of system attributes, a set of architectural properties corresponding to the one or more unified architecture models to be designed.

3. The method of claim 1, wherein the step of synthesizing the architectural structure is iteratively performed to generate the plurality of architectural specifications corresponding to the one or more unified architecture models to be designed.

4. The method of claim 1, wherein the one or more unified architecture models are unified across the plurality of architectural layers.

5. A system (100) for designing one or more unified architecture models for architecting digital products and digital services, the system (100) comprising:
    a memory (102) storing instructions;
    one or more communication interfaces (106); and
    one or more hardware processors (104) coupled to the memory (102) via the one or more communication interfaces (106), wherein the one or more hardware processors (104) are configured by the instructions to:
        define, a plurality of architectural layers corresponding to the one or more unified architecture models to be designed;
        perform, for each of the plurality of architectural layers, a plurality of steps in a sequence, wherein the plurality of steps comprise:
            identify, a first set of information acquired from a plurality of sources, wherein the first set of information comprises architectural requirements and concerns corresponding to a plurality of digital products and digital services to be architected;
            extract, based upon the first set of information, a second set of information comprising a contextual analysis of the one or more unified architecture models to be designed;
            derive, from the second set of information, a third set of information comprising value propositions corresponding to the one or more unified architecture models to be designed;
            formulate, based upon the third set of information, a set of architectural objectives corresponding to the one or more unified architecture models to be designed;
            define, based upon the set of architectural objectives, a plurality of system attributes comprising a framework for executing a set of architectural functions, wherein the plurality of system attributes and the set of architectural functions correspond to the one or more unified architecture models to be designed;
            synthesize, based upon the plurality of system attributes defined, an architectural structure comprising a plurality of architectural specifications corresponding to the one or more unified architecture models to be designed; and
            design, based upon the architectural structure, a plurality of architectural processes defining a sequence of steps for architecting the plurality of digital products and digital services, wherein each of the plurality of architectural processes correspond to one of the plurality of architectural layers defined;
        extract, based upon each of the plurality of architectural processes, an architectural layer specification for each of the plurality of architectural layers; and
        design, based upon the architectural layer specification extracted for each of the plurality of architectural layers, the one or more unified architecture models for architecting the plurality of digital products and digital services.

6. The system (100) of claim 5, wherein the one or more hardware processors (104) are configured to synthesize the architectural structure by defining, based upon the plurality of system attributes, a set of architectural properties corresponding to the one or more unified architecture models to be designed.

7. The system (100) of claim 5, wherein the one or more hardware processors (104) are configured to iteratively perform the step of synthesizing the architectural structure to generate the plurality of architectural specifications corresponding to the one or more unified architecture models to be designed.

8. The system (100) of claim 5, wherein the one or more unified architecture models are unified across the plurality of architectural layers.

9. One or more non-transitory machine readable information storage mediums comprising one or more instructions which when executed by one or more hardware processors causes the one or more hardware processor to perform a method for designing one or more unified architecture models for architecting digital products and digital services, said method comprising:
 defining, by one or more hardware processors, a plurality of architectural layers corresponding to the one or more unified architecture models to be designed;
 performing, for each of the plurality of architectural layers, a plurality of steps in a sequence, wherein the plurality of steps comprise:
  identifying, a first set of information acquired from a plurality of sources, wherein the first set of information comprises architectural requirements and concerns corresponding to a plurality of digital products and digital services to be architected;
  extracting, based upon the first set of information, a second set of information comprising a contextual analysis of the one or more unified architecture models to be designed;
  deriving, from the second set of information, a third set of information comprising value propositions corresponding to the one or more unified architecture models to be designed;
  formulating, based upon the third set of information, a set of architectural objectives corresponding to the one or more unified architecture models to be designed;
  defining, based upon the set of architectural objectives, a plurality of system attributes comprising a framework for executing a set of architectural functions, wherein the plurality of system attributes and the set of architectural functions correspond to the one or more unified architecture models to be designed;
  synthesizing, based upon the plurality of system attributes defined, an architectural structure comprising a plurality of architectural specifications corresponding to the one or more unified architecture models to be designed; and
  designing, based upon the architectural structure, a plurality of architectural processes defining a sequence of steps for architecting the plurality of digital products and digital services, wherein each of the plurality of architectural processes correspond to one of the plurality of architectural layers defined;
 extracting, based upon each of the plurality of architectural processes, an architectural layer specification for each of the plurality of architectural layers; and
 designing, based upon the architectural layer specification extracted for each of the plurality of architectural layers, the one or more unified architecture models for architecting the plurality of digital products and digital services.

10. The one or more non-transitory machine readable information storage mediums of claim 9, wherein the step of synthesizing the architectural structure comprises defining, based upon the plurality of system attributes, a set of architectural properties corresponding to the one or more unified architecture models to be designed.

11. The one or more non-transitory machine readable information storage mediums of claim 9, the step of synthesizing the architectural structure is iteratively performed to generate the plurality of architectural specifications corresponding to the one or more unified architecture models to be designed.

12. The one or more non-transitory machine readable information storage mediums of claim 9, wherein the one or more unified architecture models are unified across the plurality of architectural layers.

* * * * *